United States Patent
Kanada

(10) Patent No.: US 10,821,832 B2
(45) Date of Patent: Nov. 3, 2020

(54) BATTERY CONTROL DEVICE AND BATTERY CONTROL SYSTEM

(71) Applicant: TOYOTA JIDOSHA KABUSHIKI KAISHA, Toyota-shi, Aichi-ken (JP)

(72) Inventor: Ryo Kanada, Toyota (JP)

(73) Assignee: TOYOTA JIDOSHA KABUSHIKI KAISHA, Toyota-shi, Aichi-ken (JP)

( * ) Notice: Subject to any disclaimer, the term of this patent is extended or adjusted under 35 U.S.C. 154(b) by 294 days.

(21) Appl. No.: 15/916,358

(22) Filed: Mar. 9, 2018

(65) Prior Publication Data

US 2018/0264969 A1 Sep. 20, 2018

(30) Foreign Application Priority Data

Mar. 17, 2017 (JP) .................................. 2017-053005

(51) Int. Cl.
*B60L 3/00* (2019.01)
*G01R 31/36* (2020.01)
(Continued)

(52) U.S. Cl.
CPC ............... *B60L 3/0046* (2013.01); *B60L 3/10* (2013.01); *B60L 7/10* (2013.01); *B60L 58/10* (2019.02);
(Continued)

(58) Field of Classification Search
CPC .... B60L 7/10; B60L 3/10; B60L 58/10; B60L 3/0046; B60L 58/13; B60L 2240/62;
(Continued)

(56) References Cited

U.S. PATENT DOCUMENTS 7,087,341 B2 * 8/2006 Hampden-Smith ....... B22F 9/24
429/406
8,521,350 B2 * 8/2013 Minamiura ............. B60L 58/12
701/22
(Continued)

FOREIGN PATENT DOCUMENTS

JP    2007-153148 A    6/2007
JP    2009-278745 A    11/2009
(Continued)

*Primary Examiner* — M Baye Diao
(74) *Attorney, Agent, or Firm* — Sughrue Mion, PLLC

(57) ABSTRACT

A battery control device includes a positional information acquiring unit, a deposition-risk-geographic-point storing unit, a determination unit, and a deposition-deterring-mode executing unit. The positional information acquiring unit is a processing unit that acquires positional information of a vehicle. The deposition-risk-geographic-point storing unit stores deposition risk geographic points. The determination unit determines whether or not the vehicle passes at least one of the deposition risk geographic points stored in the deposition-risk-geographic-point storing unit based on the positional information of the vehicle that is acquired by the positional information acquiring unit. The deposition-deterring-mode executing unit controls a battery based on a predetermined deposition-deterring mode, if the determination unit determines that the vehicle passes the at least one of the deposition risk geographic points.

16 Claims, 2 Drawing Sheets

(51) Int. Cl.
    *H01M 10/48*     (2006.01)
    *H01M 10/42*     (2006.01)
    *B60L 58/10*     (2019.01)
    *B60L 3/10*     (2006.01)
    *B60L 7/10*     (2006.01)
    *G01R 31/382*     (2019.01)
    *G01S 19/34*     (2010.01)
    *G01S 19/42*     (2010.01)

(52) U.S. Cl.
    CPC .............. *G01R 31/36* (2013.01); *G01S 19/34* (2013.01); *H01M 10/425* (2013.01); *H01M 10/48* (2013.01); *B60L 2240/62* (2013.01); *G01R 31/382* (2019.01); *G01S 19/42* (2013.01); *H01M 2010/4271* (2013.01); *H01M 2220/20* (2013.01); *Y02T 10/70* (2013.01); *Y02T 90/16* (2013.01); *Y02T 90/167* (2013.01); *Y04S 30/12* (2013.01)

(58) Field of Classification Search
    CPC ........... B60L 2240/66; B60L 2240/622; B60L 2260/50; H01M 10/425; H01M 10/48; H01M 2220/20; H01M 2010/4271; G01S 19/34; G01S 19/42; G01R 31/36; G01R 31/382; Y02T 90/161; Y02T 90/168; Y02T 10/7005; Y04S 30/12

USPC ........................................................ 320/136
See application file for complete search history.

(56) References Cited

U.S. PATENT DOCUMENTS

| | | | |
|---|---|---|---|
| 9,413,042 B2 * | 8/2016 | Golubkov | H01M 10/48 |
| 10,024,252 B2 * | 7/2018 | Dixon | F02D 41/0077 |
| 2011/0057618 A1 | 3/2011 | Izumi | |
| 2014/0309354 A1 * | 10/2014 | Feng | C08K 3/346 |
| | | | 524/450 |
| 2015/0016062 A1 * | 1/2015 | Robert | H05K 7/2029 |
| | | | 361/700 |
| 2015/0155604 A1 | 6/2015 | Fuchimoto et al. | |

FOREIGN PATENT DOCUMENTS

| | | |
|---|---|---|
| JP | 2010-028963 A | 2/2010 |
| JP | 2013-172476 A | 9/2013 |
| JP | 2014-6683 A | 1/2014 |
| JP | 2014-17074 A | 1/2014 |
| JP | 2014-072932 A | 4/2014 |

\* cited by examiner

BATTERY CONTROL DEVICE AND BATTERY CONTROL SYSTEM

CROSS REFERENCE TO RELATED APPLICATIONS

The present application claims priority from Japanese Patent Application No. 2017-053005 filed on Mar. 17, 2017, which is incorporated by reference herein in its entirety.

BACKGROUND

The present invention relates to battery control devices and battery control systems.

JP 2013-172476 A discloses an information notification system that notifies a user of advice information for reducing deterioration of a secondary battery. In the publication, it is expected that the notification of the advice information to the user improves user's vehicle usage so as to control deterioration of the secondary battery. The publication lists primary factors that accelerate deterioration of a secondary battery as follows: the frequency at which the secondary battery goes into a predetermined low-voltage condition, the frequency at which the secondary battery goes into a predetermined high-voltage condition, the frequency at which the secondary battery goes into a predetermined high-discharge power condition. It also discloses that, if it is determined that the factor that is specified based on meteorological data and history data of slipping and gripping of the vehicle originates from slipping and gripping on snow-covered or ice-covered roadway, it cannot be dealt with even when the user vehicle usage is improved.

JP 2010-028963 A discloses an electric vehicle system that can offer an optimum usable SOC range according to the environmental temperature so as to effectively utilize the capacity of the on-board battery.

JP 2014-072932 A discloses a device that estimates the degree of deterioration of a battery. The device disclosed in the publication acquires, from each of a plurality of vehicles, route segment information about the route segment in which the vehicle has traveled, as well as information about the battery capacity, information about the battery temperature, and information about C rates when traveling the route segment. Based on the various pieces of information that has been acquired, the device calculates a statistical value of battery capacity change, a statistical value of battery temperature change, and a statistical value of C when traveling a predetermined route segment. Based on the calculated results, the device estimates the expected degree of deterioration of the battery when traveling the predetermined route segment.

SUMMARY

In electric vehicles, such as hybrid electric vehicles and electric automobiles, electric power is stored in a secondary battery incorporated in the vehicles. The vehicles are provided with such a mechanism that drives a motor with the secondary battery to rotate driving wheels to cause the vehicles to travel. In such electric vehicles, the secondary battery is charged by regenerative power as needed. The regenerative power is generated, for example, when the accelerator is switched between ON or OFF, or when the torque on the rotary shaft of the motor changes. For example, when a slipping condition and a gripping condition of a driving wheel changes from one to another, it is possible that the torque on the rotary shaft of the motor may change greatly, and consequently a high regenerative power (high current pulse) arises. A high regenerative power may also arise when, for example, the accelerator pedal is suddenly released.

A high charge current value resulting from regenerative power, if left unchanged, can be a cause of deposition of a reaction-involved substance in the secondary battery. For example, in a lithium-ion secondary battery, in which its reaction-involved substance is lithium ion, metallic lithium deposits inside the battery. It is desirable to minimize such deposition of the reaction-involved substance. The deposition of the reaction-involved substance may be deterred by, for example, setting the upper limit of the charge current value, or by setting the upper limit of the state of charge (SOC) of the battery. However, this limits the utilization of the secondary battery. Consequently, it is difficult to enhance the fuel mileage performance of the vehicle or improve the electric travel of the vehicle.

On the other hand, it is possible to perform control of setting the upper limit of the charge current value by detecting a sudden torque fluctuation of the vehicle (for example, by detecting a change of a driving wheel between a slipping condition and a gripping condition). However, the driving wheels may suddenly undergo slipping or gripping depending on the condition of the road surface on which the vehicle travels. In such cases, an abrupt torque fluctuation of the vehicle occurs in an extremely short time, and high charge current arises in an extremely short time. In controlling a vehicle, information is obtained from sensors every predetermined unit time. However, such a control operation of controlling the upper limit of the charge current of the battery after detecting a changeover of the driving wheel between a slipping condition and gripping condition is not quick enough that high charge current may be input into the battery.

A battery control device proposed herein includes a positional information acquiring unit, a deposition-risk-geographic-point storing unit, a determination unit, and a deposition-deterring-mode executing unit. The positional information acquiring unit is a processing unit that acquires positional information of a vehicle. The deposition-risk-geographic-point storing unit stores deposition risk geographic points. The determination unit determines whether or not the vehicle passes at least one of the deposition risk geographic points stored in the deposition-risk-geographic-point storing unit based on the positional information of the vehicle that is acquired by the positional information acquiring unit. The deposition-deterring-mode executing unit controls a battery based on a predetermined deposition-deterring mode, if the determination unit determines that the vehicle passes the at least one of the deposition risk geographic points. Such a battery control device executes the deposition-deterring mode when the vehicle passes a deposition risk geographic point. This prevents the battery from such an event as deposition of the reaction-involved substance even when the torque fluctuation of the vehicle suddenly exceeds a predetermined threshold value while the vehicle is passing a deposition risk geographic point. Herein, the deposition risk geographic point may not necessarily be a geographic point in a strict sense. The deposition risk geographic point may include a concept such as a section or a zone, which contains a series of geographic points.

It is possible that in the deposition-deterring mode, at least one of the following processes may be executed: a process of increasing a predetermined negative electrode potential, a process of reducing a predetermined negative electrode resistance, and a process of reducing a predetermined load.

The battery control device may further include a first processing section configured to register a destination of the vehicle, and a second processing section configured to acquire a planned route to the destination in prepared map information. The deposition-risk-geographic-point storing unit may store the deposition risk geographic points in association with the prepared map information. The determination unit may determine whether or not the planned route contains at least one of the deposition risk geographic points.

The battery control device may further include a detecting section configured to detect a geographic point at which a torque fluctuation of the vehicle exceeds a predetermined threshold value, and a third processing section configured to determine the geographic point at which the torque fluctuation of the vehicle exceeds the predetermined threshold value, detected by the detecting unit, to be a deposition risk geographic point.

The battery control device may further include a fourth processing section configured to execute: a process of counting the number of times the vehicle has passed the geographic point, detected by the detecting section, at which the torque fluctuation of the vehicle exceeds the predetermined threshold value; a process of calculating a frequency at which the torque fluctuation of the vehicle exceeds the predetermined threshold value against the number of times the vehicle has passed the geographic point, and a process of determining a geographic point at which the frequency is higher than a predetermined threshold value to be a deposition risk geographic point.

The battery control device may further include a fifth processing section configured to transmit information on the deposition risk geographic points to a first external database. The battery control device may further include a sixth processing section configured to acquire, from a second external database storing the information on deposition risk geographic points, information on at least one of the deposition risk geographic points. The battery control device may further include an inter-vehicle communication unit data-communicably connected to another vehicle, and a seventh processing section configured acquire information on the deposition risk geographic points.

The battery control device may further include: an eighth processing section configured to acquire meteorological information from a third external database storing the meteorological information; a ninth processing section configured to store respective quantified deposition-risk values for a plurality of predetermined geographic points in prepared map information, and correct the quantified deposition-risk values according to a predetermined correction equation containing a correction value based on the meteorological information; and a tenth processing section configured to determine geographic points in which the corrected quantified deposition-risk values, corrected by the ninth processing section, exceed a predetermined threshold value, to be deposition risk geographic points.

In this case, the battery control device may further include an eleventh processing section configured to acquire road surface information from a fourth external database storing road surface information, and the correction equation may contain a correction value based on the road surface information.

The battery control device may further include: a twelfth processing section configured to acquire road surface information from a fourth external database storing road surface information; a thirteenth processing section configured to store respective quantified deposition-risk values for a plurality of predetermined geographic points in prepared map information, and correct the quantified deposition-risk values according to a predetermined correction equation containing a correction value based on the road surface information; and a fourteenth processing section configured to determine geographic points in which the corrected quantified deposition-risk values, corrected by the thirteenth processing section, exceed a predetermined threshold value, to be deposition risk geographic points.

An embodiment of a battery control system proposed herein includes a vehicle, a first external database, a communication device data-communicably connecting the vehicle and the first database, and a processing device configured to set deposition risk geographic points.

The vehicle includes a detecting section configured to detect a geographic point at which a torque fluctuation of the vehicle exceeds a predetermined threshold value, and a fifteenth processing section configured to transmit positional information of geographic points, detected by the detecting section, at which the torque fluctuation of the vehicle exceeds the predetermined threshold value, to the first external database.

The processing device sets the deposition risk geographic points based on the positional information transmitted to the first database.

This battery control system sets deposition risk geographic points based on the positional information, which is sent from the vehicle, of the geographic points at which the torque fluctuation exceeds a predetermined threshold value.

In this case, the processing device may count the number of times a vehicle has passed a geographic point the positional information of which has been transmitted to the first database, calculate a frequency at which a torque fluctuation exceeds a predetermined threshold value against the number of times the vehicle has passed the geographic point, and determine a geographic point at which the frequency is higher than a predetermined threshold value to be a deposition risk geographic point.

Herein, the frequency at which the torque fluctuation exceeds a predetermined threshold value may be calculated for separate categories, for example, for different time periods, seasons, weather, and temperatures. The frequency at which an abrupt torque fluctuation occurs may be different even on the same day, depending on the time of day, for example, between a time period at dawn, in which the air temperature is low, and a time period during daytime, in which the air temperature is relatively high. The frequency at which an abrupt torque fluctuation occurs may also vary depending on seasons, weather, and air temperature. For this reason, it is preferable that the frequency at which the torque fluctuation exceeds a predetermined threshold value be calculated for separate categories, for example, for different time periods, seasons, weather, temperatures, and so forth. Then, the calculated frequencies may preferably be categorized by time period, season, weather, air temperature, and so forth, and stored in a predetermined storage unit, a database, or the like. In addition, when using the frequency at which the torque fluctuation exceeds a predetermined threshold value, it is preferable that the frequencies be used selectively based on associated information of the time period, the season, the weather, the air temperature, and so forth, which is acquired separately. This makes it possible to selectively utilize more accurate information on the deposition risk geographic point. Such a way of calculation and utilization of the frequency at which the torque fluctuation exceeds a predetermined threshold value may also be applied similarly to a later-described battery control system.

Another embodiment of the battery control system may include the foregoing battery control device, a second external database storing deposition risk geographic points, a communication device data-communicably connecting the battery control device and the second external database to each other, and a processing device.

In this case, the processing device may be configured to cause the information on the deposition risk geographic points stored in the second external database to be stored in the deposition-risk-geographic-point storing unit of the battery control device.

In this case, the battery control system is able to provide the battery control system with information on a deposition risk geographic point from the second external database, which stores information on the deposition risk geographic points.

Such another embodiment of the battery control system may further include a third external database storing meteorological information. In this case, the information on the deposition risk geographic points stored in the second external database may include quantified deposition-risk values. It is preferable that the quantified deposition-risk values be corrected according to a predetermined correction equation containing a correction value based on the meteorological information acquired from the third external database. It is preferable that the processing device cause information on geographic points in which the corrected quantified deposition-risk values exceed a predetermined threshold value to be stored in the deposition-risk-geographic-point storing unit of the battery control device.

The battery control system may further include a fourth external database storing road surface information. In this case, the information on the deposition risk geographic points stored in the second external database may include quantified deposition-risk values. It is preferable that the quantified deposition-risk values be corrected according to a predetermined correction equation containing a correction value based on the road surface information acquired from the fourth external database. It is preferable that the processing device cause information on geographic points in which the corrected quantified deposition-risk values exceed a predetermined threshold value to be stored in the deposition-risk-geographic-point storing unit of the battery control device.

DETAILED DESCRIPTION OF THE PREFERRED EMBODIMENTS

Hereinbelow, embodiments will be described of a battery control device and a battery control system proposed herein. It should be noted that the embodiments described herein are, of course, not intended to limit the present invention. The present invention is not limited to the embodiments described herein unless specifically stated otherwise.

Figure 1:
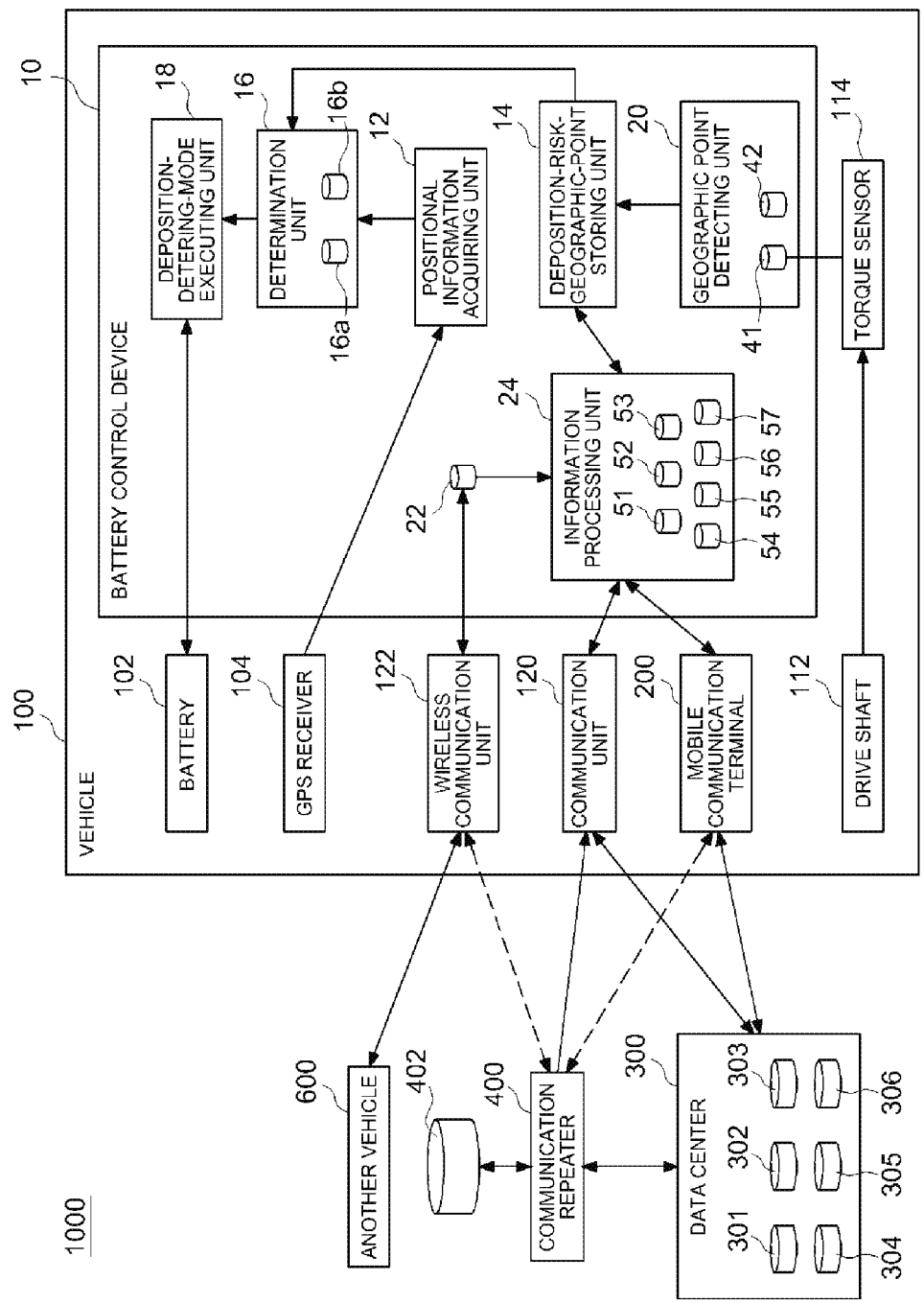
FIG. 1 is a block diagram illustrating an embodiment of a battery control device 10 and a battery control system 1000 proposed herein.

FIG. 1 is a block diagram illustrating an embodiment of a battery control device 10 and a battery control system 1000 proposed herein. The configurations of the battery control device 10 and the battery control system 1000 will be described with reference to FIG. 1 when appropriate.

As illustrated in FIG. 1, the battery control device 10 proposed herein includes a positional information acquiring unit 12, a deposition-risk-geographic-point storing unit 14, a determination unit 16, a deposition-deterring-mode executing unit 18, a geographic point detecting unit 20, an inter-vehicle communication unit 22, and an information processing unit 24.

The battery control device 10 is typically a computer. The battery control device 10 includes, for example, an interface (I/F) that receives data or the like from external devices such as a host computer, a central processing unit (CPU) that executes control program instructions, a ROM that stores programs to be executed by the CPU, a RAM that is used as a working area for deploying the programs, and a storage device (or a storage medium), such as a memory, that stores the foregoing programs and various data. Each of various functions of the battery control device 10 may be implemented by a cooperative combination of hardware and a computer that executes predetermined programs. Each of various processes executed by the battery control device 10 may be implemented as a processing module that is executed by a program predetermined in the battery control device 10. In vehicle applications, such as incorporated in an electric motor vehicle 100, the battery control device 10 may be incorporated in a portion of a battery control unit that controls a battery 102. Herein, the electric motor vehicle may be referred to simply as "vehicle", as appropriate.

The positional information acquiring unit 12 is a processing module that acquires the positional information of the vehicle 100 that incorporates the battery control device 10, for example. For example, the positional information acquiring unit 12 may acquire the positional information from a GPS receiver 104 incorporated in the vehicle 100.

The deposition-risk-geographic-point storing unit 14 herein is a processing module that stores deposition risk geographic points. Here, the deposition risk geographic point may be defined as a geographic point at which a high regenerative power is likely to be generated while the vehicle is traveling, such as a geographic point at which a driving wheel is likely to slip. The deposition risk geographic points may be stored in association with, for example, map information that has been prepared in advance. For example, in the map information, the geographic points are identified based on position coordinate information, such as latitude and longitude. In this case, the position coordinate information of the deposition risk geographic points may preferably be stored so that each of the deposition risk geographic points can be identified in such map information. For the map information, any existing map information system may be used. When a series of deposition risk geographic points exists in a map, it is possible that a deposition risk geographic point may be interpreted as a deposition risk section or a deposition risk zone that contains a series of deposition risk geographic points. In other words, a deposition risk geographic point may include a deposition risk section or a deposition risk zone.

The determination unit 16 is a processing module that determines whether or not the vehicle 100 passes a deposition risk geographic point stored in the deposition-risk-geographic-point storing unit 14 based on the positional information of the vehicle 100 that is acquired by the positional information acquiring unit 12. The position at which the vehicle 100 is traveling may be identified in the map information, for example, by a navigation system. In that way, it may be predicted that the vehicle 100 passes a deposition risk geographic point.

For example, the battery control device 10 may include a processing section 16a that registers a destination of the vehicle 100, and a processing section 16b that acquires a planned route to the destination in prepared map information that has been prepared in advance. The determination unit 16 may preferably determine whether or not there is a deposition risk geographic point on the planned route. Herein, the process of registering the destination of the vehicle 100 and the process of acquiring the planned route to the destination in the prepared map may be implemented, for example, in an existing navigation system. If the determination unit 16 determines that there is a deposition risk geographic point on the planned route, it is preferable to execute the process of the deposition-deterring-mode executing unit 18. The information on the deposition risk geographic points may be utilized in, for example, an existing navigation system, to display the deposition risk geographic points on the map or to notify the driver at appropriate timing that the vehicle 100 passes a deposition risk geographic point.

The determination unit 16 determines whether or not the distance between a deposition risk geographic point stored in the deposition-risk-geographic-point storing unit 14 and the vehicle 100 is within a predetermined distance, based on the positional information of the vehicle 100 that is acquired by the positional information acquiring unit 12. In this case, it is possible that, if the distance between the vehicle 100 and a deposition risk geographic point stored in the deposition-risk-geographic-point storing unit 14 is within a predetermined distance, it may be determined that the vehicle 100 passes the deposition risk geographic point, and the process of the deposition-deterring-mode executing unit 18 may be executed. Thus, the battery control device 10 may not necessarily be provided with a navigation system. Herein, the distance between the vehicle 100 and the deposition risk geographic point stored in the deposition-risk-geographic-point storing unit 14 may be set to an appropriate distance depending on its relationship with the later-described processes to be executed by the deposition-deterring-mode executing unit 18, the speed of the vehicle 100, and the like. The distance between the vehicle 100 and the deposition risk geographic point stored in the deposition-risk-geographic-point storing unit 14 may be set to an appropriate distance, such as 1 km, 5 km, or 10 km.

The deposition-deterring-mode executing unit 18 controls the battery 102 based on a predetermined deposition-deterring mode, if the determination unit 16 determines that the vehicle 100 passes a deposition risk geographic point. Thus, when the vehicle 100 passes a deposition risk geographic point, the deposition-deterring mode is executed. As a result, even when the vehicle 100 passes a deposition risk geographic point and the torque fluctuation of the vehicle 100 exceeds a predetermined threshold value, deposition of the reaction-involved substance does not occur easily, preventing deterioration of the battery 102.

Herein, in the deposition-deterring mode, at least one of the following processes is executed: a process of increasing a predetermined negative electrode potential; a process of reducing a predetermined negative electrode resistance; and a process of reducing a predetermined load.

Examples of the process of increasing a predetermined negative electrode potential may include a process of reducing the SOC of the battery and a process of reducing the battery voltage. A specific example is a process of reducing the upper limit SOC of the battery 102.

The process of reducing a predetermined negative electrode resistance may be a process of increasing the battery temperature, for example.

The process of reducing a predetermined load may be a process of increasing the power control frequency, for example.

For the process of reducing the upper limit SOC of the battery 102, it is preferable to execute a process of forcibly discharging the battery 102 or a process of reducing the SOC of the battery 102 when the battery 102 is at a higher SOC than a predetermined threshold value. Alternatively, the upper limit SOC may be lowered in controlling the battery 102.

In the process of increasing the battery temperature, the battery 102 is heated to a predetermined temperature by a heater attached to the battery 102. This makes it possible to deter deposition of the reaction-involved substance.

Furthermore, in the process of increasing the frequency of power control, it is preferable to execute a process of making the frequency of power control shorter. By making the frequency of power control shorter, it becomes possible to immediately suppress the upper limit value of the charge current of the battery 102 by power control when, for example, the vehicle 100 is switched from a slipping condition to a gripping condition.

The deposition-deterring-mode executing unit 18 may appropriately combine any of the above-described processes as the deposition-deterring mode.

Figure 2:
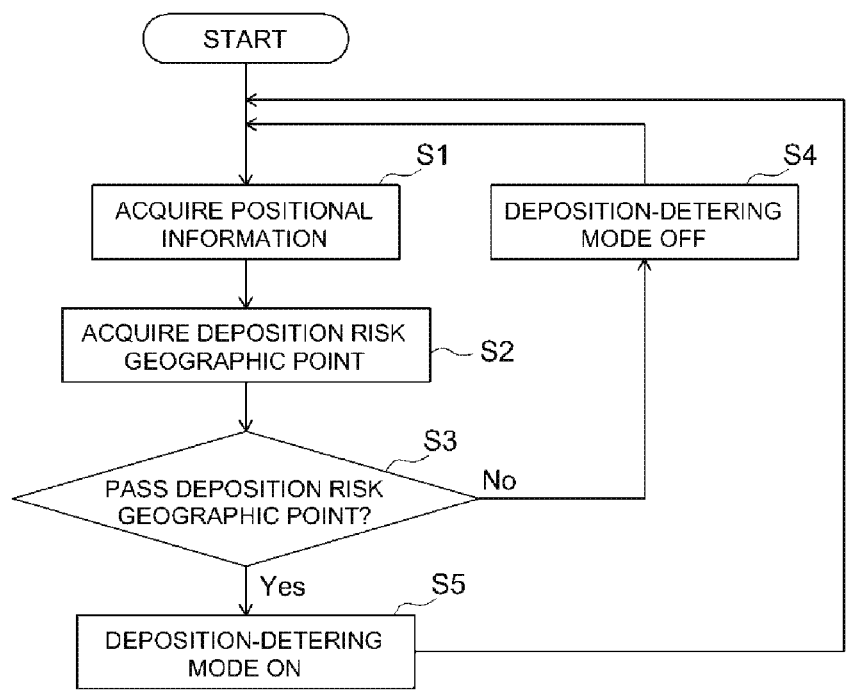
FIG. 2 is a flowchart illustrating a process flow of the battery control device 10.

FIG. 2 is a flowchart illustrating a process flow of the battery control device 10.

As illustrated in FIG. 2, the battery control device 10 acquires positional information of the vehicle 100 (S1). The positional information of the vehicle 100 is acquired by the positional information acquiring unit 12. Next, a deposition risk geographic point is acquired (S2). As the deposition risk geographic point, it is possible to acquire the positional information of a deposition risk geographic point stored in the deposition-risk-geographic-point storing unit 14. Next, it is determined whether or not the vehicle 100 passes the deposition risk geographic point (S3). Such a determination is executed by the determination unit 16. If such a determination process S3 determines that the vehicle 100 does not pass the deposition risk geographic point (No), the deposition-deterring mode is turned off (S4). If such a determination process S3 determines that the vehicle 100 passes the deposition risk geographic point (Yes), the deposition-deterring mode is turned on, and the deposition-deterring-mode executing unit 18 executes the deposition-deterring mode (S5). Thereafter, the procedure from the process S1 of acquiring the positional information of the vehicle 100 to the just-described determination process S3 is repeated, and the deposition-deterring mode may be executed in the process S5 as needed.

Thus, if it is predicted that the vehicle 100 passes a deposition risk geographic point, the battery control device 10 executes the deposition-deterring mode before the vehicle 100 passes the deposition risk geographic point. This means that, when the vehicle 100 passes the deposition risk geographic point, the deposition-deterring mode is executed. As a result, even in cases where the torque fluctuation of the vehicle 100 suddenly exceeds a predetermined threshold value when the vehicle 100 passes a deposition risk geographic point, it is possible to prevent the battery 102 from such an event as deposition of the reaction-involved substance. For example, even in cases that the vehicle 100 is suddenly switched from a slipping condition to a gripping condition, it is possible to prevent the battery 102 from such an event as deposition of the reaction-involved substance.

Note that the such a control operation of the battery control device 10 may preferably be carried out continuously while the vehicle 100 is traveling. When the vehicle 100 is at standstill, for example, it is unnecessary to perform such a control operation by the battery control device 10 because the vehicle 100 does not undergo such an event where the vehicle 100 switches from a slipping condition to a gripping condition.

The battery control device 10 may include a geographic point detecting unit 20 that detects a deposition risk geographic point. In this embodiment, the geographic point detecting unit 20 includes a detecting section 41 and a processing section 42.

Herein, the detecting section 41 is a processing module that detects that the torque fluctuation of the vehicle 100 exceeds a predetermined threshold value. The detecting section 41 may be configured, for example, to detect the torque of a drive shaft 112 of the vehicle 100 based on a detection signal from a torque sensor 114 that detects the drive shaft 112 of the vehicle 100. For example, when the vehicle 100 is in a slipping condition, the torque of the drive shaft 112 is lower than a predetermined value. On the other hand, when the vehicle 100 is in a gripping condition, the torque of the drive shaft 112 is higher than a predetermined value. Accordingly, it is desirable to detect a sudden increase of the torque of the drive shaft 112 from a low torque condition, in which the torque of the drive shaft 112 is lower than a predetermined value, to a high torque condition, in which the torque of the drive shaft 112 is higher than the predetermined value. This makes it possible to detect, for example, that the vehicle 100 is switched from a slipping condition to a gripping condition, that the vehicle 100 is switched from a gripping condition to a slipping condition, and that the accelerator pedal is suddenly released from a depressed condition.

In addition, the detecting section 41 that detects a torque fluctuation of the vehicle 100 that exceeds a predetermined threshold value may adopt other detection methods. For example, it is also possible that the torque fluctuation of the vehicle 100 that exceeds a predetermined threshold value may be detected by detecting that the vehicle 100 is switched from a slipping condition to a gripping condition.

It is possible to detect that the vehicle 100 is switched from a slipping condition to a gripping condition based on the difference between the wheel speed and the vehicle speed. Herein, the wheel speed can be detected from the number of revolution of a wheel. The vehicle speed may be detected, for example, based on the road surface speed detected from images taken by an on-board camera. It is possible to detect that the vehicle 100 is switched from a slipping condition to a gripping condition by, for example, a vehicle stability control (VSC) system. In this case, it is possible to detect that the vehicle stability control system has detected that the vehicle 100 is switched from a slipping condition to a gripping condition.

In another embodiment, the detecting section 41 may monitor the regenerative current of the vehicle 100 to detect a geographic point at which a regenerative current higher than a predetermined threshold value is generated. When the battery is charged by regenerative current, the battery voltage suddenly increases as a result of charging with high current. As another embodiment of the detecting section 41, it is possible to record the battery voltage at every unit time and detect the ultimate voltage when the battery voltage has suddenly increased.

The processing section 42 determines a geographic point at which the torque fluctuation of the vehicle 100 exceeds a predetermined threshold value, which is detected by the detecting section 41, to be a deposition risk geographic point, based on the positional information of the vehicle 100 that is acquired by the positional information acquiring unit 12. In other words, the processing section 42 identifies the position at which the vehicle 100 passes at the time when the detecting section 41 detects the change of the vehicle 100 from a slipping condition to a gripping condition, based on the positional information of the vehicle 100 that is acquired by the positional information acquiring unit 12. Then, the position through which the vehicle 100 passes at the time when it is detected that the torque fluctuation of the vehicle 100 exceeds a predetermined threshold value is stored as a deposition risk geographic point.

Since the deposition risk geographic point is stored in this way, it is possible to predict that the torque fluctuation of the vehicle 100 may exceed the predetermined threshold value when the vehicle 100 passes the deposition risk geographic point from then on. Thus, through the determination unit 16 as described above, it is possible to execute the process by the deposition-deterring-mode executing unit 18 in advance before the vehicle 100 passes the deposition risk geographic point. This makes it possible to prevent deposition of the reaction-involved substance in the battery 102.

Here, another embodiment of the process of identifying a deposition risk geographic point will be described below. For example, the processing section 42 may count the number of times the vehicle 100 has passed the geographic point, detected by the detecting section 41, at which the torque fluctuation of the vehicle 100 exceeds a predetermined threshold value. Then, the processing section 42 calculates the frequency at which the torque fluctuation of the vehicle 100 exceeds the predetermined threshold value against the number of times the vehicle 100 has passed the geographic point. Then, the processing section 42 executes a process of determining the geographic point at which the just-described frequency is higher than a predetermined threshold value to be a deposition risk geographic point.

Through this process, the battery control device 10 determines a geographic point at which the torque fluctuation of the vehicle 100 is likely to exceed a predetermined threshold value as a deposition risk geographic point. Because the geographic points with a high frequency at which the torque fluctuation of the vehicle 100 exceeds a predetermined threshold value are stored as the deposition risk geographic points, the deposition-deterring-mode executing unit 18 is not executed excessively. In this process, the more the travel record of the vehicle 100 increases, the higher the accuracy of the deposition risk geographic point becomes.

In this way, the deposition risk geographic points may be stored based on the information obtained by actual travel of the vehicle 100. In the embodiment shown in FIG. 1, the battery control device 10 is provided with a processing section 51 that transmits the information on the deposition risk geographic points stored in the vehicle 100 to a first external database 301. In this case, the first database 301 stores the information on deposition risk geographic points that are stored in the vehicle 100. In this case, the vehicle 100 may preferably include a communication unit 120 that is suitable to be data-communicably connected to the first database 301. The battery control device 10 may preferably include the information processing unit 24 that communicates with various types of first external database 301 through the communication unit 120.

The first database 301 may be configured to receive information of deposition risk geographic points from other vehicles 100 each provided with a similar battery control device 10. In this case, the information of deposition risk geographic points is collectively gathered in the first database 301. Thus, the information of deposition risk geographic points can be collected from a plurality of vehicles, and big data about the information of deposition risk geographic points can be obtained. The obtained big data about the information of deposition risk geographic points may be shared among a plurality of vehicles each provided with a similar battery control device 10.

Moreover, the battery control device 10 may further include a processing section 52 that acquires information on a deposition risk geographic point from a second external database 302 storing the information on deposition risk geographic points. Such a second external database 302 may be provided in, for example, a predetermined data center 300, as illustrated in FIG. 1. The vehicle 100 may acquire the information on deposition risk geographic points from the second external database 302 via the communication unit 120 as needed. The information on deposition risk geographic points that is acquired by the processing section 52 may be stored in the deposition-risk-geographic-point storing unit 14. This enables the determination unit 16 to utilize the information on deposition risk geographic points that is acquired by the processing section 52 in the process of determining whether or not the vehicle 100 passes a deposition risk geographic point.

In this case, the battery control device 10 can acquire the information of deposition risk geographic points from the second external database 302 as needed. Accordingly, it is preferable that the deposition-risk-geographic-point storing unit 14 store the information on the deposition risk geographic points within a predetermined range (for example, within a range of 10 km in radius) from the vehicle 100 based on the positional information, for example. This serves to minimize the amount of information on deposition risk geographic points to be stored in the deposition-risk-geographic-point storing unit 14 and also to reduce the load of the determination process executed by the determination unit 16.

The battery control device 10 also includes the inter-vehicle communication unit 22 and a processing section 53. The inter-vehicle communication unit 22 is a processing module that data-communicably connect the vehicle 100 and another vehicle 600 to each other. For example, each of the vehicle 100 and the other vehicle 600 may incorporate a wireless communication unit 122 capable of communicating within a distance of about 10 m to about 500 m in radius. The inter-vehicle communication unit 22 data-communicably connects the vehicle 100 to the other vehicle 600 in cooperation with the wireless communication unit 122.

The processing section 53 is a processing module that acquires the information on deposition risk geographic points from the other vehicle 600. The processing section 53 may be configured to be able to exchange the information on deposition risk geographic points with the other vehicle 600 when the vehicle 100 passes by the other vehicle 600. This makes it possible to acquire the information on deposition risk geographic points in a simplified manner, without making communication with the data center 300. In this case, it is expected that the other vehicle 600 that passes by has taken the route that the vehicle 100 is planning to take. Thus, it is expected to efficiently obtain most up-to-date information on the deposition risk geographic points that exist on the route that the vehicle 100 is planning to take. Since the battery control device 10 includes the processing section 53 that acquires the information on deposition risk geographic points from the other vehicle 600, the battery control device 10 can exchange the information on deposition risk geographic points when the vehicle 100 passes by the other vehicle 600. Therefore, the system of the battery control device 10 can function appropriately even in circumstances in which the battery control device 10 is unable to communicate with the data center 300.

Such a system that the information on deposition risk geographic points can be exchanged with another vehicle 600 when passing by the other vehicle 600 can be implemented with an inter-vehicle information and telecommunication network. This makes it possible to construct, for example, a system that does not require a central server such as the data center 300. The system that does not require a central server is able to reduce the system operational cost. It is also possible to use the system that can exchange the information on deposition risk geographic points with the other vehicle 600 when passing by the other vehicle 600 in combination with the system that obtains the information on deposition risk geographic points through data communication with a central server, such as the data center 300. The inter-vehicle information and telecommunication network may be put into practical use when, for example, the vehicles will incorporate autonomous driving control and information and telecommunication technology in in the future. In that case, it is possible to utilize such an inter-vehicle information and telecommunication network for autonomous driving control, for example.

In addition, the event in which the torque fluctuation of the vehicle 100 exceeds a predetermined threshold value may be affected by, for example, weather and road surface conditions. In the embodiment shown in FIG. 1, the battery control device 10 also includes a processing section 54, a processing section 55, a processing section 56, and a processing section 57.

Herein, the processing section 54 is a processing module that acquires meteorological information. The processing section 54 may preferably be configured to acquire meteorological information from, for example, a third external database 303 that stores the meteorological information. The third external database 303 is able to quantify the degree of influence on deposition risk for each geographic area, based on the most up-to-date meteorological information. For example, it is possible to predict that the road surface is wet or ice-covered based on the meteorological information. In such cases, the vehicle 100 slips easily. For this reason, it is preferable that an appropriate correction value be set so that the quantified deposition-risk value is increased according to the meteorological information.

The processing section 55 is a processing module that corrects quantified deposition-risk values. The processing section 55 stores respective quantified deposition-risk values for a plurality of predetermined geographic points on prepared map information, for example. Then, the processing section 55 corrects the quantified deposition-risk values according to a predetermined correction equation containing a correction value based on meteorological information.

The processing section 56 is a processing module that executes a process of determining a geographic point in which the corrected deposition risk value exceeds a predetermined threshold value, to be a deposition risk geographic point.

For example, in the information on a deposition risk geographic point stored in the deposition-risk-geographic-point storing unit 14 of the battery control device 10, when the quantified deposition-risk value is less than a predetermined threshold value, it indicates, for example, a sunny day at a relatively high air temperature; accordingly, this geographic point is not determined to be a deposition risk geographic point. On the other hand, on a rainy day or when it is expected that the road is covered with ice, the deposition risk becomes high. In this embodiment, the processing section 54 acquires meteorological information. Then, the processing section 55 corrects the quantified deposition-risk values according to a correction value that is determined based on the meteorological information.

Here, the correction value based on the meteorological information may preferably be set, for example, so that the correction value is determined based on the meteorological information according to a predetermined correspondence table or a predetermined calculation equation. As a result, if the processing section 56 determines a geographic point at which the corrected deposition risk value exceeds a predetermined threshold value to be a deposition risk geographic point, the deposition-deterring-mode executing unit 18 is executed by the process of the determination unit 16 before the vehicle 100 passes the geographic point. Thus, even when the deposition risk is high due to the meteorological condition, the deposition-deterring mode is executed as needed according to the meteorological condition. This reduces the risk of deposition of the reaction-involved substance in the battery 102 even when the torque fluctuation of the vehicle 100 exceeds a predetermined threshold value.

The battery control device 10 may further include a processing section 57 that acquires road surface information.

The above-mentioned correction equation of the processing section 55 may contain a correction value based on the road surface information. Herein, the processing section 57 that acquires road surface information is, for example, a processing module that is configured to acquire road surface information from a fourth external database 304 that stores road surface information. For example, road surface information, such as the information indicating that the road is slippery with rain, the information indicating that the road is covered with ice, and the information indicating that snow chains are required because of snow fall, may be obtained from various sources such as road traffic information and big data that are collected from vehicles.

In the fourth external database 304, the degree of influence on deposition risk for each geographic area may preferably be quantified based on the most up-to-date road surface information. Specifically, the vehicle 100 slips easily, for example, when the road surface is wet or when the road surface is covered with ice. Here, it is preferable to set an appropriate correction value obtained by evaluating the likelihood of slipping of the vehicle 100 based on the road surface information, according to a predetermined correspondence table or a predetermined calculation equation. As a result, if the processing section 56 determines a geographic point at which the corrected deposition risk value exceeds a predetermined threshold value to be a deposition risk geographic point, the deposition-deterring-mode executing unit 18 is executed by the process of the determination unit 16 before the vehicle 100 passes the geographic point. In this case, the correction equation prepared in the processing section 55 may not contain the above-described correction value based on the meteorological information, but may contain only the correction value based on the road surface information.

Next, the battery control system 1000 will be described below.

In this embodiment, the battery control system 1000 includes a first database 301, a second database 302, a third database 303, and a fourth database 304, as illustrated in FIG. 1. Each of the first database 301 to the fourth database 304 is an external database that is provided external to the vehicle 100. In the embodiment shown in FIG. 1, the first database 301 to the fourth database 304 are provided in a facility that is called a data center 300. For example, the first database 301 may be placed in the data center 300 that is accessible from the vehicle 100 via an information and telecommunication network, such as the Internet. In this case, the vehicle 100 may include a communication device that is communicable with the first database 301 via the Internet. In this case, the vehicle 100 may be connected to the data center 300 via, for example, an on-board mobile communication terminal 200, such as a smartphone.

The first database 301 is a database that stores geographic points at which the vehicle 100 is switched from a slipping condition to a gripping condition.

The second database 302 is a database that stores information on deposition risk geographic points;

The third database 303 is a database that stores meteorological information.

The fourth database 304 is a database that stores road surface information.

Various embodiments of the battery control system 1000 are possible. Some examples will be described below.

In a first embodiment, the battery control system 1000 includes a vehicle 100, a communication device that connects the vehicle 100 and the first database 301 data-communicably to each other, and a processing device 305, as illustrated in FIG. 1. In the example shown in FIG. 1, the communication device may be composed of a communication means through the communication unit 120 or the mobile communication terminal 200, provided on-board the vehicle 100.

The vehicle 100 includes the detecting section 41 that detects a geographic point at which the torque fluctuation of the vehicle 100 exceeds a predetermined threshold value. In this embodiment, the detecting section 41 includes a processing module that transmits a geographic point at which the torque fluctuation of the vehicle 100 exceeds the predetermined threshold value, to the first database 301. Herein, this processing module serves the same function as that of the foregoing processing section 51. In the battery control system 1000 of this embodiment, the geographic points at which the torque fluctuation of the vehicle 100 exceeds the predetermined threshold value are transmitted to the first database 301. In the battery control system 1000, the information on the geographic points at which the torque fluctuation of the vehicle 100 exceeds the predetermined threshold value is collected. Based on the information on the geographic points at which the torque fluctuation of the vehicle 100 exceeds the predetermined threshold value, big data are obtained about the geographic points, road route segments, and geographic areas where the torque fluctuation of the vehicle 100 is likely to be large.

The deposition risk geographic points may be organized based on such big data and provided to the vehicle 100. In this case, the battery control system 1000 may collect the information on the geographic points at which the torque fluctuation of the vehicle 100 exceeds the predetermined threshold value from various vehicles that are communicable with the battery control system 1000. From the viewpoint of obtaining the big data as described above, the vehicles may preferably be provided with the function of detecting the geographic points at which the torque fluctuation of the vehicle 100 exceeds a predetermined threshold value. For example, it should not matter whether or not the vehicles is provided with such a function of executing the deposition-deterring mode. The torque fluctuation of the vehicle 100 is detected by, for example, a vehicle stability control (VSC) system. The geographic points are detected by a navigation system or a GPS receiver, for example. Thus, the information on the geographic points at which the torque fluctuation of the vehicle 100 exceeds the predetermined threshold value can be collected from various vehicles that are provided with such a detection system.

The battery control system 1000 includes the processing device 305. The processing device 305 determines the deposition risk geographic points based on the positional information transmitted to the first database 301. For example, the processing device 305 acquires the number of times vehicles have passed a geographic point whose positional information is transmitted to the first database 301. In addition, the processing device 305 calculates the frequency at which the torque fluctuation of the vehicle 100 exceeds the predetermined threshold value against the number of times the vehicles have passed the geographic point. Then, the processing device 305 determines a geographic point at which the just-described frequency exceeds a predetermined threshold value to be a deposition risk geographic point. The information of the deposition risk geographic points thus determined may be provided, for example, to the battery control device 10 of the vehicle 100, which is configured to execute the deposition-deterring mode.

Herein, the number of time the vehicles have passed a geographic point may preferably be obtained by counting the number of times the vehicles have passed the geographic point. It is preferable that the number of time the vehicles have passed a geographic point should be obtained from the vehicles that have passed the geographic point. The information indicating that a vehicle has passed the geographic point may preferably be transmitted from the vehicle when the vehicle has passed the geographic point in cooperation with a controller incorporated in the vehicle which is provided with a GPS receiver. The information transmitted from the vehicles is sent to the first database 301 through, for example, the on-board communication unit 120 and/or the mobile communication terminal 200, as described above. From the viewpoint of calculating the frequency at which the torque fluctuation of the vehicle 100 exceeds a predetermined threshold value, the vehicles should be able to send, to the first database 301, the information on the geographic points at which the torque fluctuation of the vehicle 100 exceeds a predetermined threshold value.

The processing device 305 calculates the frequency at which the torque fluctuation of the vehicle 100 exceeds a predetermined threshold value against the number of times vehicles have passed the geographic point. Then, the processing device 305 determines a geographic point at which the just-described frequency exceeds a predetermined threshold value to be a deposition risk geographic point. This process makes it possible to determine a geographic point that causes the frequency at which the torque fluctuation of the vehicle 100 exceeds a predetermined threshold value to be equal to or higher than a predetermined frequency, to be a deposition risk geographic point. Such a process of calculating the frequency for the geographic points at which the torque fluctuation of the vehicle 100 exceeds a predetermined threshold value and determining a geographic point with a high frequency to be a deposition risk geographic point, which is carried out by the vehicles, may also be carried out in the battery control system 1000. The battery control system 1000 collects data from a large number of vehicles. Therefore, the battery control system 1000 is able to properly evaluate the frequency at which the torque fluctuation of the vehicle 100 exceeds a predetermined threshold value and evaluate the deposition risk more appropriately.

In another embodiment, the battery control system 1000 may include the battery control device 10 including the deposition-deterring-mode executing unit 18 as described above, the communication unit 120 data-communicably connecting the battery control device 10 and the second database 302, and a processing device 306. The second database 302 stores deposition risk geographic points. In this case, the processing device 306 may be configured to cause the information on the deposition risk geographic points stored in the second external database 302 to be stored in the deposition-risk-geographic-point storing unit 14 of the battery control device 10, which is provided on-board the vehicle 100. In this case, the battery control device 10 provided on-board the vehicle can obtain the information on deposition risk geographic points from the second external database 302. Therefore, the battery control device 10 does not need to store a large amount of information on deposition risk geographic points. As a result, it is possible to reduce the capacity of the memory storage devices, for example, required by the battery control device 10.

In this embodiment, the battery control system 1000 may further include a third external database 303 that stores meteorological information. In this case, the information on the deposition risk geographic points stored in the second database 302 may preferably contain quantified deposition-risk values. In this embodiment, the battery control system 1000 corrects the quantified deposition-risk value according to a predetermined correction equation containing a correction value based on the meteorological information acquired from the third external database 303. Also, it is preferable that the processing device 306 be configured to cause the geographic points in which the corrected quantified deposition-risk values exceed a predetermined threshold value to be stored in the deposition-risk-geographic-point storing unit 14 of the battery control device 10. This allows the deposition-risk-geographic-point storing unit 14 to store the deposition risk geographic points that are corrected according to the meteorological information.

In another embodiment, the battery control system 1000 may further include a fourth external database 304 that stores road surface information. In this case, it is preferable that the information on deposition risk geographic points stored in the second external database 302 include quantified deposition-risk values. In this embodiment, the battery control system 1000 may preferably correct the quantified deposition-risk values according to a predetermined correction equation containing a correction value based on the road surface information, and the processing device 306 may preferably be configured to cause the geographic points in which the corrected quantified deposition-risk values exceeds a predetermined threshold value to be stored in the deposition-risk-geographic-point storing unit 14 of the battery control device 10. This allows the deposition-risk-geographic-point storing unit 14 to store the deposition risk geographic points that are corrected according to the road surface information.

Various embodiments of the battery control system 1000 have been described hereinabove. However, the configuration of the battery control system 1000 is not limited to the foregoing embodiments. Although various types of databases are placed in the data center in the foregoing embodiments, it is also possible that the various types of databases may be placed, for example, in a communication repeater 400 that is communicable with the vehicle 100. The communication repeater 400 is a communication facility that covers a predetermined geographic area. The communication repeater 400 may be date-communicably connected to a data center such as described above, or it may be a facility independent of the data center 300.

For example, the vehicle 100 communicates with the communication repeater 400 as needed, to transmit the information on deposition risk geographic points. The communication repeater 400 may transmit the information on deposition risk geographic points, which is received from the vehicle 100, to the first database 301 as needed. Thus, the information on deposition risk geographic points may be transmitted to the first database 301 placed in the data center 300 via the communication repeater 400. In this case, the vehicle 100 may preferably include a communication device that is communicable with the communication repeater 400. For such a communication device, it is possible to use, for example, the communication unit 120 that communicates with the above-described data center 300, the wireless communication unit 122 that communicates with the other vehicle 600, and the mobile communication terminal 200 provided on-board the vehicle. In another embodiment, for example, when a communication system that forms an inter-vehicle information and telecommunication network is established, the vehicle 100 may be connected via the inter-vehicle information and telecommunication network to the data center 300 as an extension of the inter-vehicle information and telecommunication network.

The communication repeater 400 may include a database 402 that stores information such as information on deposition risk geographic points. This enables the communication repeater 400 to store the deposition risk geographic points on neighboring roads in the database 402. Thus, each of the databases 301 to 304 of the battery control system 1000 may be placed in a communication facility that is placed on a road or in the vicinity of the road. For example, the communication repeater 400 may be installed in, for example, an electric billboard that is installed on major roads, expressways, and so forth.

Various embodiments of the battery control device and the battery control system proposed herein have been described hereinabove. The embodiments of the battery control device and the battery control system that have been described herein do not limit the scope of the present invention, unless specifically stated otherwise.

What is claimed is:

1. A battery control device comprising:
 a positional information acquiring unit configured to acquire positional information of a vehicle;
 a deposition-risk-geographic-point storing unit configured to store deposition risk geographic points;
 a determination unit configured to determine whether or not the vehicle passes at least one of the deposition risk geographic points stored in the deposition-risk-geographic-point storing unit, based on the positional information of the vehicle that is acquired by the positional information acquiring unit; and
 a deposition-deterring-mode executing unit configured to control a battery based on a predetermined deposition-deterring mode, if the determination unit determines that the vehicle passes at least one of the deposition risk geographic points.

2. The battery control device according to claim 1, wherein in the deposition-deterring mode, at least one of the following processes is executed: a process of increasing a predetermined negative electrode potential; a process of reducing a predetermined negative electrode resistance; and a process of reducing a predetermined load.

3. The battery control device according to claim 1, further comprising:
 a first processing section configured to register a destination of the vehicle; and
 a second processing section configured to acquire a planned route to the destination in prepared map information, and wherein:
 the deposition-risk-geographic-point storing unit stores the deposition risk geographic points in association with the prepared map information; and
 the determination unit determines whether or not the planned route contains at least one of the deposition risk geographic points.

4. The battery control device according to claim 1, further comprising:
 a detecting section configured to detect a geographic point at which a torque fluctuation of the vehicle exceeds a predetermined threshold value; and
 a first processing section configured to determine the geographic point at which the torque fluctuation of the vehicle exceeds a predetermined threshold value, detected by the detecting unit, to be a deposition risk geographic point.

5. The battery control device according to claim 1, further comprising:
 a detecting section configured to detect a geographic point at which a torque fluctuation of the vehicle exceeds a predetermined threshold value; and
 a processing section configured to execute: a process of counting the number of times the vehicle has passed the geographic point, detected by the detecting section, at which the torque fluctuation of the vehicle exceeds the predetermined threshold value; a process of calculating a frequency at which the torque fluctuation of the vehicle exceeds the predetermined threshold value against the number of times the vehicle has passed the geographic point; and a process of determining a geographic point at which the frequency is higher than a predetermined threshold value to be a deposition risk geographic point.

6. The battery control device according to claim 4, further comprising a second processing section configured to transmit information on the deposition risk geographic points to an external database.

7. The battery control device according to claim 1, further comprising a processing section configured to acquire, from an external database storing information on the deposition risk geographic points, information on at least one of the deposition risk geographic points.

8. The battery control device according to claim 1, further comprising:
 an inter-vehicle communication unit data-communicably connected to another vehicle; and
 a processing section configured to acquire information on the deposition risk geographic points from the other vehicle.

9. The battery control device according to claim 1, further comprising:
 a first processing section configured to acquire meteorological information from an external database storing the meteorological information;
 a second processing section configured to store respective quantified deposition-risk values for a plurality of predetermined geographic points in prepared map information, and correct the quantified deposition-risk values according to a predetermined correction equation containing a correction value based on the meteorological information; and a third processing section configured to determine geographic points in which the corrected quantified deposition-risk values, corrected by the second processing section, exceeds a predetermined threshold value, to be the deposition risk geographic points.

10. The battery control device according to claim 9, further comprising:

fourth processing section configured to acquire road surface information from a second external database storing the road surface information, and wherein the correction equation contains a correction value based on the road surface information.

11. The battery control device according to claim 1, further comprising:

a first processing section configured to acquire road surface information from an external database storing the road surface information;

a second processing section configured to store respective quantified deposition-risk values for a plurality of predetermined geographic points in prepared map information, and correct the quantified deposition-risk values according to a predetermined correction equation containing a correction value based on the road surface information; and a third processing section configured to determine geographic points in which the corrected quantified deposition-risk values, corrected by the second processing section, exceeds a predetermined threshold value, to be the deposition risk geographic points.

12. A battery control system comprising:
a vehicle;
a first external database;
a communication device configured to data-communicably connect the vehicle and the first external database to each other; and
a processing device configured to set deposition risk geographic points, wherein:
the vehicle includes:
a detecting section configured to detect a geographic point at which a torque fluctuation of the vehicle exceeds a predetermined threshold value; and
a processing section configured to transmit positional information of the geographic point, detected by the detecting section, at which the torque fluctuation of the vehicle exceeds the predetermined threshold value, to the first external database, wherein
the processing device sets the deposition risk geographic points based on the positional information transmitted to the first database.

13. The battery control system according to claim 12, wherein the processing device counts the number of times a vehicle has passed a geographic point the positional information of which has been transmitted to the first external database, calculates a frequency at which a torque fluctuation exceeds a predetermined threshold value against the number of times the vehicle has passed the geographic point, and determines a geographic point at which the frequency is higher than a predetermined threshold value to be a deposition risk geographic point.

14. A battery control system comprising:
a battery control device according to claim 1;
a first external database storing information on deposition risk geographic points;
a communication device configured to data-communicably connect the battery control device and the first external database to each other; and
a processing device,
the processing device configured to cause the information on the deposition risk geographic points stored in the first external database to be stored in the deposition-risk-geographic-point storing unit.

15. The battery control system according to claim 14, further comprising:

a second external database storing meteorological information, and wherein:

the information on the deposition risk geographic points stored in the first external database includes quantified deposition-risk values; and at least one of the quantified deposition-risk values is corrected according to a predetermined correction equation containing a correction value based on the meteorological information acquired from the second external database, and the processing device causes information on geographic points in which the corrected quantified deposition-risk values exceed a predetermined threshold value to be stored in the deposition-risk-geographic-point storing unit of the battery control device.

16. The battery control system according to claim 14, further comprising:

a second external database storing road surface information, and wherein:

the information on the deposition risk geographic points stored in the first external database includes quantified deposition-risk values; and at least one of the quantified deposition-risk values of the deposition risk geographic points is corrected according to a predetermined correction equation containing a correction value based on the road surface information acquired from the second external database, and the processing device causes information on geographic points in which the corrected quantified deposition-risk values exceed a predetermined threshold value to be stored in the deposition-risk-geographic-point storing unit of the battery control device.

* * * * *